United States Patent
Kawasoe

(10) Patent No.: US 9,030,264 B2
(45) Date of Patent: May 12, 2015

(54) CURRENT OUTPUT CONTROL DEVICE, CURRENT OUTPUT CONTROL METHOD, DIGITALLY CONTROLLED OSCILLATOR, DIGITAL PLL, FREQUENCY SYNTHESIZER, DIGITAL FLL, AND SEMICONDUCTOR DEVICE

(71) Applicant: LAPIS Semiconductor Co., Ltd., Yokohama (JP)

(72) Inventor: Suguru Kawasoe, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 48 days.

(21) Appl. No.: 13/906,275

(22) Filed: May 30, 2013

(65) Prior Publication Data

US 2013/0328603 A1 Dec. 12, 2013

(30) Foreign Application Priority Data

Jun. 6, 2012 (JP) ................. 2012-129123

(51) Int. Cl.
*H03M 1/68* (2006.01)
*H03M 1/74* (2006.01)
*H03K 3/03* (2006.01)
*H03L 7/085* (2006.01)
*H03L 7/08* (2006.01)
*H02M 3/157* (2006.01)
*H03L 7/099* (2006.01)

(52) U.S. Cl.
CPC ............. *H03M 1/685* (2013.01); *H03L 7/0802* (2013.01); *H02M 3/157* (2013.01); *H03M 1/747* (2013.01); *H03K 3/0315* (2013.01); *H03L 7/0995* (2013.01)

(58) Field of Classification Search
CPC .... H03M 1/685; H03M 1/747; H03L 7/0991; H03L 7/099; H03L 7/0802; H03L 2207/50; H03K 3/0315
USPC ........... 341/144, 145; 331/57, 34, 179, 177 R
See application file for complete search history.

(56) References Cited

U.S. PATENT DOCUMENTS

| | | | |
|---|---|---|---|
| 5,933,107 A * | 8/1999 | Tan ............................... | 341/144 |
| 7,586,429 B1 * | 9/2009 | Cerusa et al. ................. | 341/144 |
| 7,663,446 B1 * | 2/2010 | Surin ............................ | 331/185 |
| 7,940,097 B2 * | 5/2011 | Chen ............................. | 327/158 |
| 2011/0267122 A1 * | 11/2011 | Jeong et al. .................. | 327/165 |

FOREIGN PATENT DOCUMENTS

| | | |
|---|---|---|
| JP | 2002-335155 A | 11/2002 |
| JP | 2011-205339 A | 10/2011 |

* cited by examiner

*Primary Examiner* — Ryan Johnson
(74) *Attorney, Agent, or Firm* — Rabin & Berdo, P.C.

(57) ABSTRACT

A current output control device is provided that includes: a current cell array section including plural current cell circuits that are each connected in parallel between a first terminal (power source) and a second terminal (ground) that connect between the first terminal and the second terminal in by operation ON so as to increase control current flowing between the first terminal and the second terminal; and a code conversion section (decoder) that generates signals (row codes, column codes) to ON/OFF control current cells so as to change the number of current cells that connect the first terminal and the second terminal according to change in an externally input code and that inputs the generated signals to the current cell array section.

19 Claims, 7 Drawing Sheets

CURRENT OUTPUT CONTROL DEVICE, CURRENT OUTPUT CONTROL METHOD, DIGITALLY CONTROLLED OSCILLATOR, DIGITAL PLL, FREQUENCY SYNTHESIZER, DIGITAL FLL, AND SEMICONDUCTOR DEVICE

CROSS-REFERENCE TO RELATED APPLICATION

This application is based on and claims priority under 35 USC 119 from Japanese Patent Application No. 2012-129123 filed on Jun. 6, 2012, the disclosure of which is incorporated by reference herein.

BACKGROUND

1. Technical Field

The present invention relates to a current output control device, a current output control method, a digitally controlled oscillator, a digital PLL, a frequency synthesizer, a digital FLL and a semiconductor device that control an output current value according to change in an input code. For instance, the present invention relates to a current output control device, a current output control method, a digitally controlled oscillator, a digital PLL, a frequency synthesizer, a digital FLL and a semiconductor device that are suitable for operating at high precision in response to change in an input code.

2. Related Art

Recently, digital PLL circuits with digitalized control signals of Phase Locked Loop (PLL) circuits are being employed in electronic devices such as mobile phones, communication devices and personal computers. Digital PLL circuits replace analogue circuits with digital circuits, and accordingly due to advances in processors enable space savings to be achieved and power savings to be made.

For example, a clock signal controlled by PLL is employed as a system clock signal of a microprocessor. Advances are being made in lower power consumption (lower current consumption) of microcontrollers (referred to below as microcomputers) equipped with microprocessors. There are accordingly more occasions in which microcomputers are operated intermittently. When such intermittent operation is performed using an analogue PLL, the charge of a charge amplifier is discharged whenever the PLL is switched OFF, and capacity needs to be charged from zero when the PLL is switched back ON, with this impeding power consumption reduction.

There are descriptions related to digital PLLs in, for example, Japanese Patent Application Laid-Open (JP-A) No. 2002-335155 (Patent Document 1) and JP-A No. 2011-205339 (Patent Document 2). Patent Documents 1 and 2 describe All Digital PLLs (ADPLLs) in which all of the control signals of the PLL circuit are digitalized.

In such an ADPLL there is also a large difference to previous analogue PLLs in relation to the control method of the oscillation circuit. Namely, in an analogue PLL, a Voltage Controlled Oscillator (VCO) is employed in which the oscillation frequency is determined by the voltage level of capacity charged by charge of an amount of phase difference to a reference clock. However in an ADPLL, generally a Digitally controlled Oscillator (DCO) is employed in which the oscillation frequency is determined by an input value of a digital code.

In an ADPLL, switching of the oscillation frequency of the Digitally controlled Oscillator (DCO) is performed by switching the code input to the DCO. Such input code switching is performed based on a specific clock.

The oscillation frequency of the DCO accordingly fluctuates when a glitch (intermittent noise) occurs due to a fluctuation in clock frequency when input code switching, with a resulting deterioration in jitter characteristics (frequency stability).

For example, in Patent Document 1, an IDAC is employed to change an output current value to change the frequency of a current control oscillation circuit. Specifically, an IDAC configured as illustrated in FIG. 7 is employed, and the oscillation frequency is changed by controlling current of a ring oscillation circuit that has each transistor connected to a current mirror circuit by switching transistors that are weighted at 2 to the power n.

In such a circuit configuration, when a code for oscillation frequency switching is input to each of the transistors weighted by transistor channel width (W)/channel length (L) and connection number, a glitch that occurs due to differences in propagation speed of each bit and due to differences in switch timing is also input.

As a result, there are sometimes occasions when a transistor is selected that is not the transistor that should have been selected. In such cases an abnormal current value is output, and the oscillation frequency of the ring oscillation circuit using this current value becomes unstable, with this being a cause of deterioration in jitter characteristics in the ring oscillation circuit.

Note that it is conceivable to use capacitance to remove glitches occurring when digital values are switched, however due to the need to add new capacitance this is not desirable from the perspectives of decreasing circuit size and lowering cost.

Moreover, Patent Document 2 is directed towards solving a problem when performing frequency control using a Binary control method in a DCO, namely to solving the problem that noise from switching readily occurs due to the influence of mismatches in parasitic capacitance and transistor characteristics at the point of change of the most significant bit. Technology is described for controlling oscillation frequency by splitting an 8 bit oscillator control word OTW [7:0] split into its upper 5 bits and lower 3 bits, and converting the upper 5 bits into an OTWb [7:3] for performing Binary control, and converting the lower 3 bits into an OTWu [13:0] for performing Unary control.

However, in the technology of Patent Document 2, glitches occurring at the time the input code input to the DCO changes when switching the oscillation frequency of the DCO cannot be avoided, and sometimes the oscillation frequency of the DCO becomes unstable.

SUMMARY

In consideration of the above circumstances, an object of the present invention is to stabilize an output value of a control current employed for switching an oscillation frequency of a DCO, and to avoid a deterioration in jitter characteristics when switching the oscillation frequency of the DCO.

In order to achieve the above object, a current output control device of the present invention includes: a current cell array section including plural current cell circuits that are each connected in parallel between a first terminal and a second terminal, whose ON/OFF state is switched by an input digital signal, that disconnect from the first terminal and the second terminal in the OFF state, that connect between the first terminal and the second terminal in the ON state so as to increase current flowing between the first terminal and the second terminal; and a code conversion section that generates digital signals to change a number of current cell circuits that are in the ON state according to change in an externally input code and that inputs the generated signals to the respective current cell circuits.

According to the present invention, a deterioration in jitter characteristics such as of a DCO that controls oscillation frequency employing a control current may be avoided due to monotonically increasing or monotonically reducing the current value of control current output according to change in the externally input code.

BRIEF DESCRIPTION OF THE DRAWINGS

Exemplary embodiments of the present invention will be described in detail based on the following figures, wherein.

DETAILED DESCRIPTION

Figure 1:
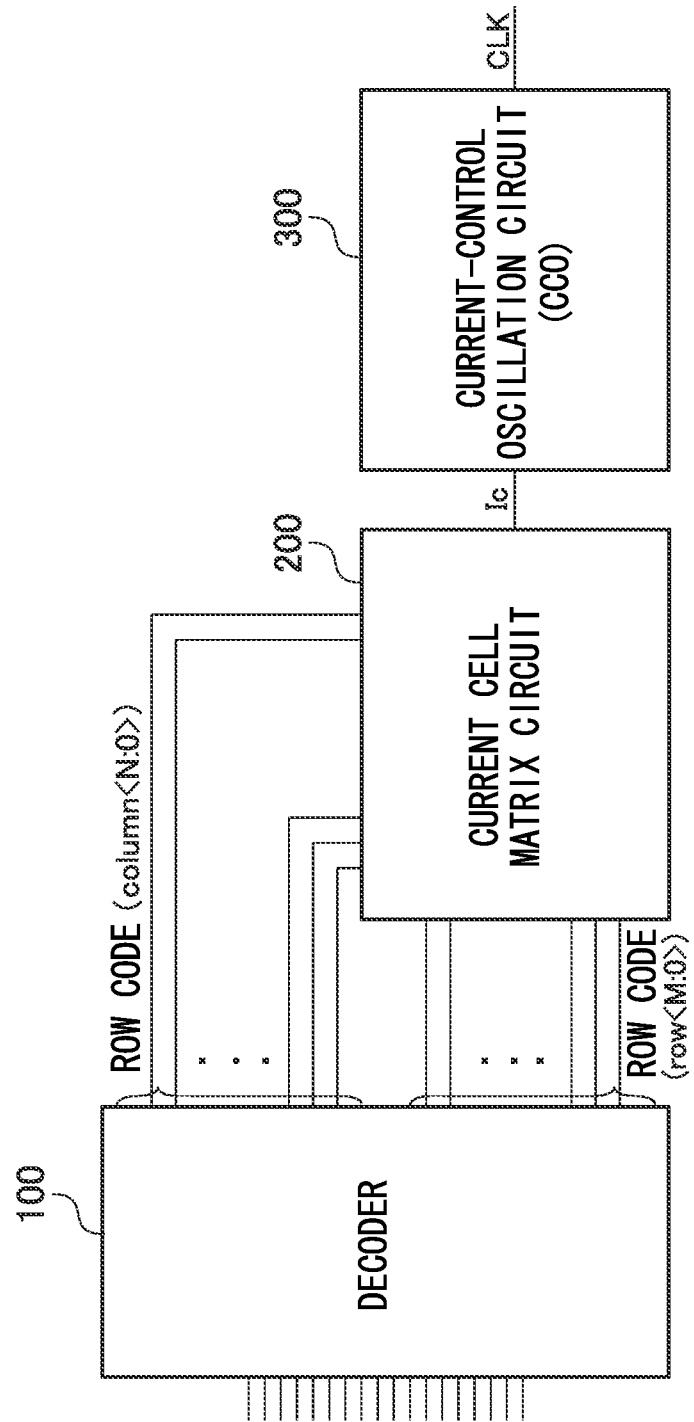
FIG. 1 is a block diagram illustrating an example of a configuration of a digitally controlled oscillator equipped with a current output control device according to an exemplary embodiment.

Explanation follows regarding an exemplary embodiment of the present invention, with reference to the drawings. FIG. 1 illustrates a configuration of a digitally controlled oscillator equipped with a current output control device according to the present exemplary embodiment, configured to include a current output control device configured by a decoder 100 and a current cell array section 200 (labeled "current cell MATRIX circuit" in the drawing), and a current-control oscillation circuit 300 (labeled "current-control oscillation circuit" in the drawing) that configures a digitally controlled oscillator by connection to the current output control device equipped with the decoder 100 and the current cell array section 200.

The current cell array section 200 includes plural current cells that are each connected in parallel between a first terminal through which flows a control current to employ in frequency control of a clock signal (CLK) in the current-control oscillation circuit 300, and a second terminal for connection to ground. ON operation of the plural current cells respectively connects together the first terminal and the second terminal and increases the control current flowing between the first terminal and the second terminal.

The decoder 100, for example, generates digital signals for ON/OFF controlling the current cells provided to the current cell array section 200 so as to change the number of current cells that connect together the first terminal and the second terminal according to a change in a code input from an external device such as a logic circuit that generates a code according to an output result from a phase comparator that compares a phase difference between a clock signal output from the current-control oscillation circuit 300 and a predetermined reference clock signal. The decoder 100 inputs the generated digital signals to the current cell array section 200.

Moreover, the current cell array section 200 is configured with current cell circuits arrayed in M rows×N columns (wherein M and N are integers of 1 or more), as illustrated in detail in FIG. 3 and FIG. 4 and described later.

The decoder 100 generates digital signals such that, as the input code becomes high (active) in sequence from the least significant bit, a specific number of cells are switched ON in sequence from the $1^{st}$ row to the $M^{th}$ row, and from each of the current cell circuits in the $1^{st}$ column to the $N^{th}$ column in each of the rows, or from the $N^{th}$ column to the $1^{st}$ column in each of the rows, and inputs the generated digital signal to the current cell array section 200.

Moreover, the decoder 100 generates digital signals such that, as the input bit code becomes low (inactive) in sequence from the most significant bit, a specific number of cells are switched OFF in sequence from the $M^{th}$ row to the $1^{st}$ row, and from the current cell circuits in the $N^{th}$ column to the $1^{st}$ column in each of the rows, or from the $1^{st}$ column to the $N^{th}$ column in each of the rows, and inputs the generated digital signal to the current cell array section 200.

Detailed explanation follows regarding the decoder 100, the current cell array section 200 and the current-control oscillation circuit 300 configuring the digitally controlled oscillator.

The decoder 100 divides and converts the input code into column codes for N columns and row codes for M rows and outputs these codes to the current cell array section 200. The current cell array section 200 is input with the column codes and the row codes output from the decoder 100, and generates a current of a current value according to each of the codes and inputs the current to the current-control oscillation circuit 300. The current-control oscillation circuit 300 generates a clock signal (CLK) of a frequency according to the current value of the input current that was generated in the current cell array section 200 and outputs the clock signal.

Figure 2:
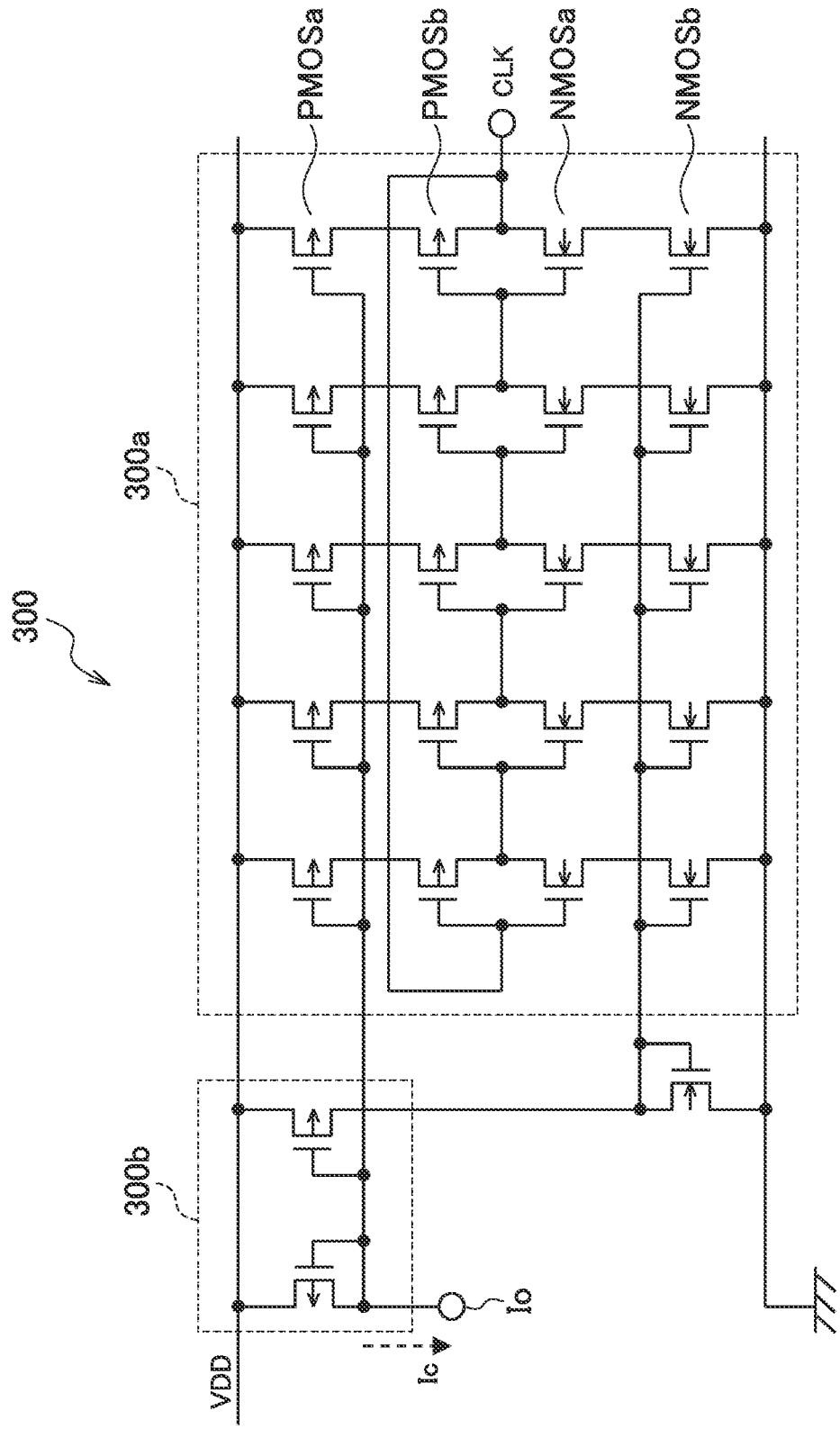
FIG. 2 is a circuit diagram illustrating an example of a circuit configuration of a current-control oscillation circuit in a digitally controlled oscillator according to an exemplary embodiment.

The current-control oscillation circuit 300 is what is referred to as a Current-Controlled Oscillator (CCO) and, as illustrated in FIG. 2, is configured including a ring oscillator 300a including NMOS transistors NMOSa, NMOSb and PMOS transistors PMOSa, PMOSb that are connected between a power source VDD and ground. A control current Ic is distributed by a current mirror circuit 300b as each current source of the ring oscillator 300a. The current-control oscillation circuit 300 generates the clock signal CLK of the frequency according to the value of the control current Ic and outputs the clock signal CLK from an output terminal.

Figure 3:
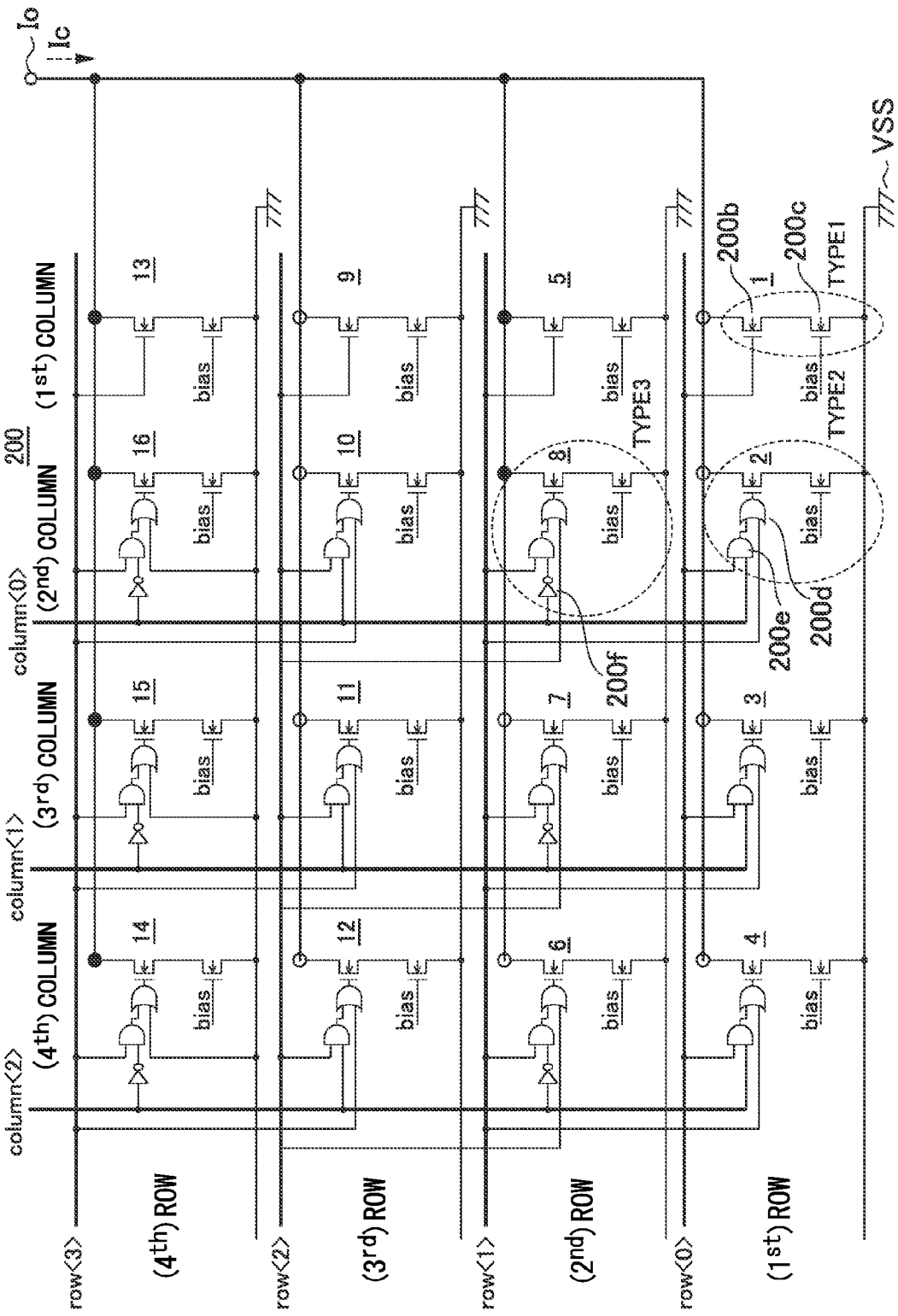
FIG. 3 is a circuit diagram illustrating an example of a circuit configuration in a current cell circuit in a digitally controlled oscillator according to an exemplary embodiment.
Figure 4:
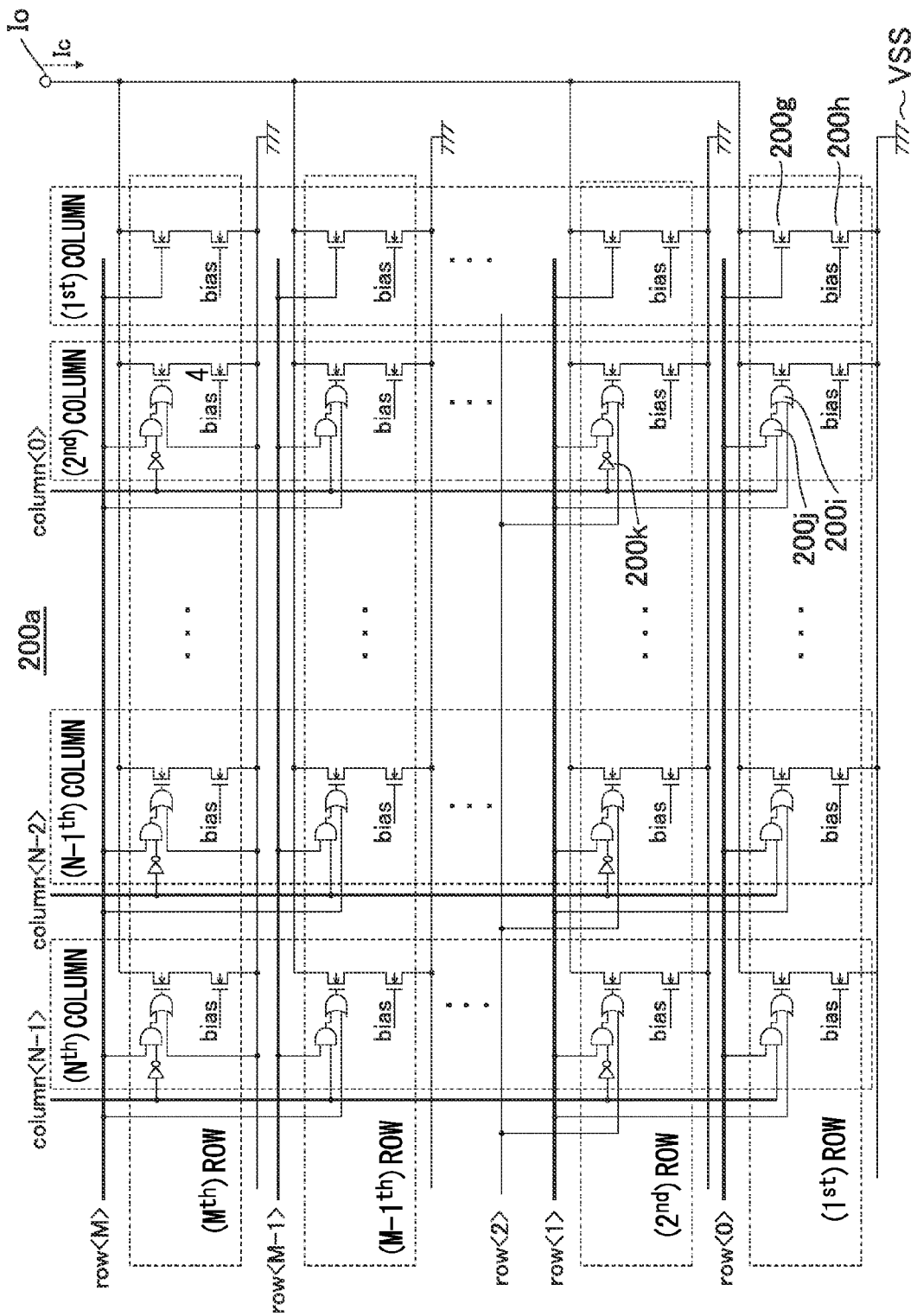
FIG. 4 is a circuit diagram illustrating another example of another circuit configuration in a current cell circuit in a digitally controlled oscillator according to an exemplary embodiment.

The current cell array section 200 is for example configured as illustrated in the example of FIG. 3, or configured as the current cell array section 200a illustrated in the example of FIG. 4. On input of multi-bit digital input signals (column codes, row codes) from the decoder 100, only the cells that correspond to the input signal are switched on (ON), and control current Ic flows between a current terminal $I_0$ and a ground terminal VSS according to the number of cells that are on.

The current cell array section 200 illustrated in FIG. 3 is arrayed in a matrix configuration of 4 rows×4 columns, however there is no limitation to such an array, and a matrix configuration of M rows×N columns may be adopted such as the current cell array section 200a illustrated in FIG. 4. Note that M may=N.

When the current cell array section is for example the current cell array section 200 of 4 row×4 column configuration illustrated in FIG. 3, the decoder 100 performs decoding as illustrated in Table 1 to generate and output a code such that in response to the input code only 1 bit is changed at a time in adjacent row codes and column codes in the output code.

TABLE 1

|  |  |  |  | Decoder Output | | | | | |
| --- | --- | --- | --- | --- | --- | --- | --- | --- | --- |
|  |  |  |  | Row Code | | | | Column Code | |
| Decoder Input | | | | row<3> | row<2> | row<1> | row<0> | column<2> | column<1> | column<0> |
| 0 | 0 | 0 | 0 | 0 | 0 | 0 | 1 | 0 | 0 | 0 |
| 0 | 0 | 0 | 1 | 0 | 0 | 0 | 1 | 0 | 0 | 1 |
| 0 | 0 | 1 | 0 | 0 | 0 | 0 | 1 | 0 | 1 | 1 |
| 0 | 0 | 1 | 1 | 0 | 0 | 0 | 1 | 1 | 1 | 1 |
| 0 | 1 | 0 | 0 | 0 | 0 | 1 | 1 | 1 | 1 | 1 |
| 0 | 1 | 0 | 1 | 0 | 0 | 1 | 1 | 0 | 1 | 1 |
| 0 | 1 | 1 | 0 | 0 | 0 | 1 | 1 | 0 | 0 | 1 |
| 0 | 1 | 1 | 1 | 0 | 0 | 1 | 1 | 0 | 0 | 0 |
| 1 | 0 | 0 | 0 | 0 | 1 | 1 | 1 | 0 | 0 | 0 |
| 1 | 0 | 0 | 1 | 0 | 1 | 1 | 1 | 0 | 0 | 1 |
| 1 | 0 | 1 | 0 | 0 | 1 | 1 | 1 | 0 | 1 | 1 |
| 1 | 0 | 1 | 1 | 0 | 1 | 1 | 1 | 1 | 1 | 1 |
| 1 | 1 | 0 | 0 | 1 | 1 | 1 | 1 | 1 | 1 | 1 |
| 1 | 1 | 0 | 1 | 1 | 1 | 1 | 1 | 0 | 1 | 1 |
| 1 | 1 | 1 | 0 | 1 | 1 | 1 | 1 | 0 | 0 | 1 |
| 1 | 1 | 1 | 1 | 1 | 1 | 1 | 1 | 0 | 0 | 0 |

In the current cell array section 200 illustrated in FIG. 3, there are the following 3 types of current cell configuration that have differing logic circuit combinations.

As illustrated ringed by intermittent lines in FIG. 3 there are: a first type (labeled as "TYPE 1" in the drawing) of the current cells 1, 5, 9, 13 that are configured with two NMOS transistors 200b, 200c connected together in series; a second type (labeled as "TYPE 2" in the drawing) of the current cells 2 to 4, 10 to 12 that are configured with the first type configuration to which logic circuits of an AND circuit 200d and an OR circuit 200e have been added; and a third type (labeled as "TYPE 3" in the drawing) of the current cells 6 to 8, 14 to 16 that are configured with the second type configuration to which a NOT circuit 200f has been added.

As illustrated in FIG. 3 and FIG. 4, the first type current cells are arrayed in the $1^{st}$ column of all the rows, the second type current cell are arrayed from the $2^{nd}$ column onwards in each of the odd numbered rows (rows 1, 3 in FIG. 3), and the third type of current cells are arrayed from the $2^{nd}$ column onwards in each of the even numbered rows (rows 2, 4 in FIG. 3).

Namely, the second type current cells and the third type of current cells are arrayed from the $2^{nd}$ column onwards, with a first type current cell in the $1^{st}$ column and second type current cells arrayed from the $2^{nd}$ column in the odd rows, such as rows 1, 3, and with a first type current cell in the $1^{st}$ column and third type current cells arrayed from the $2^{nd}$ column onwards in the even rows, such as row 2, 4.

As illustrated in FIG. 3, each of the first type current cells 1, 5, 9, 13 that are disposed in the $1^{st}$ column are configured with two NMOS transistors connected together in series, with the gate of the NMOS transistor on the control current (namely the first terminal) side connected to a row code line that is input with code data of each respective row that has been output to from the decoder 100 (row <0> to <3>), and the gate of the NMOS transistor on the ground (namely the second terminal) side input with a bias voltage bias.

Moreover, the second type current cells 2 to 4, 10 to 12 that are disposed in the odd numbered rows have an output terminal of an OR circuit connected to the gate of the control current side NMOS transistor, and an output terminal of an AND circuit connected to one of the input terminals of the OR circuit.

In the second type current cells 2 to 4 arrayed in the $1^{st}$ row, one input terminal of the AND circuit is connected to a row code line that is input with the row code (row <0>) of the respective row ($1^{st}$ row), and the other input terminal of the AND circuit is connected to a column code line that is input with a column code (column <0> to <2>) of the respective column out of column code lines input with column code data from the decoder 100. The other input terminal of the OR circuit is connected to a row code line that is input with a row code (row <1>) of the even numbered row 1 position higher than the row itself.

Similarly, in the second type current cells 10 to 12 arrayed in the $3^{rd}$ row, one input terminal of the AND circuit is connected to a row code line that is input with the row code (row <2>) of the respective row ($3^{rd}$ row), and the other input terminal of the AND circuit is connected to a column code line that is input with a column code (column <0> to <2>), and the other input terminal of the OR circuit is connected to a row code line that is input with a row code (row <3>) of the even numbered row 1 position higher than the row itself. Moreover, in the third type of current cell 6 to 8, 14 to 16 disposed in the even numbered rows, the gate of the control current side NMOS transistor is connected to the output terminal of the OR circuit, and the output terminal of the AND circuit is connected to one input terminal of the OR circuit, and the NOT circuit is connected to one input terminal of the AND circuit.

In the third type of current cells 6 to 8 arrayed in the $2^{nd}$ row, one input terminal of the AND circuit is connected to a row code line that is input with the row code (row <1>) of the respective row ($2^{nd}$ row), and the other input terminal of the AND circuit is connected to the column code line that is input through the NOT circuit with the column code of the respective column (column <0> to <2>). The other input terminal of the OR circuit is connected to the row code line that is input with the row code (row <2>) of the odd numbered row 1 position higher than the row itself.

Moreover, in the third type of current cells 14 to 16 arrayed in the 4$^{th}$ row, one input terminal of the AND circuit is connected to a row code line that is input with the row code (row <3>) of the respective row (4$^{th}$ row), and the other input terminal of the AND circuit is connected to the column code line that is input through the NOT circuit with the column code of the respective column (column <0> to <2>). The other input terminal of the OR circuit is connected to ground voltage (ground).

Explanation follows regarding operation of the current cell array section 200 of such a current cell configuration.

First, when a code is input to the decoder 100, the code is converted as illustrated in Table 1 such that row codes (row <0> to <3>) and column codes (column <0> to <2>) are output. The converted row codes and the column codes are input to the current cell array section 200, such that the number of current cells corresponding to the input codes are switched ON in the current cell array section 200.

In each of the current cells 1 to 16 in the current cell array section 200, due to being connected through the current mirror circuit 300b of the current-control oscillation circuit 300 illustrated in FIG. 2 to each of the inverters configuring the ring oscillator 300a of the current-control oscillation circuit 300, current flowing in each of the inverters increases the larger the number of current cells that are on (ON), the amount of delay in each of the inverters is reduced, and the oscillation frequency in the current-control oscillation circuit 300 rises.

In a related circuit, a glitch that occurs when the input code changes causes a temporary shift in the oscillation frequency, and is a cause of poor jitter characteristics. For example, in Table 1 as described above, misalignment occurs in the switching operation of the NMOS transistor of each of the current cells when the input code changes from "0111" to "1000", such that the exact transition that will occur to switch current cells on (ON) is indeterminate.

Figure 7:
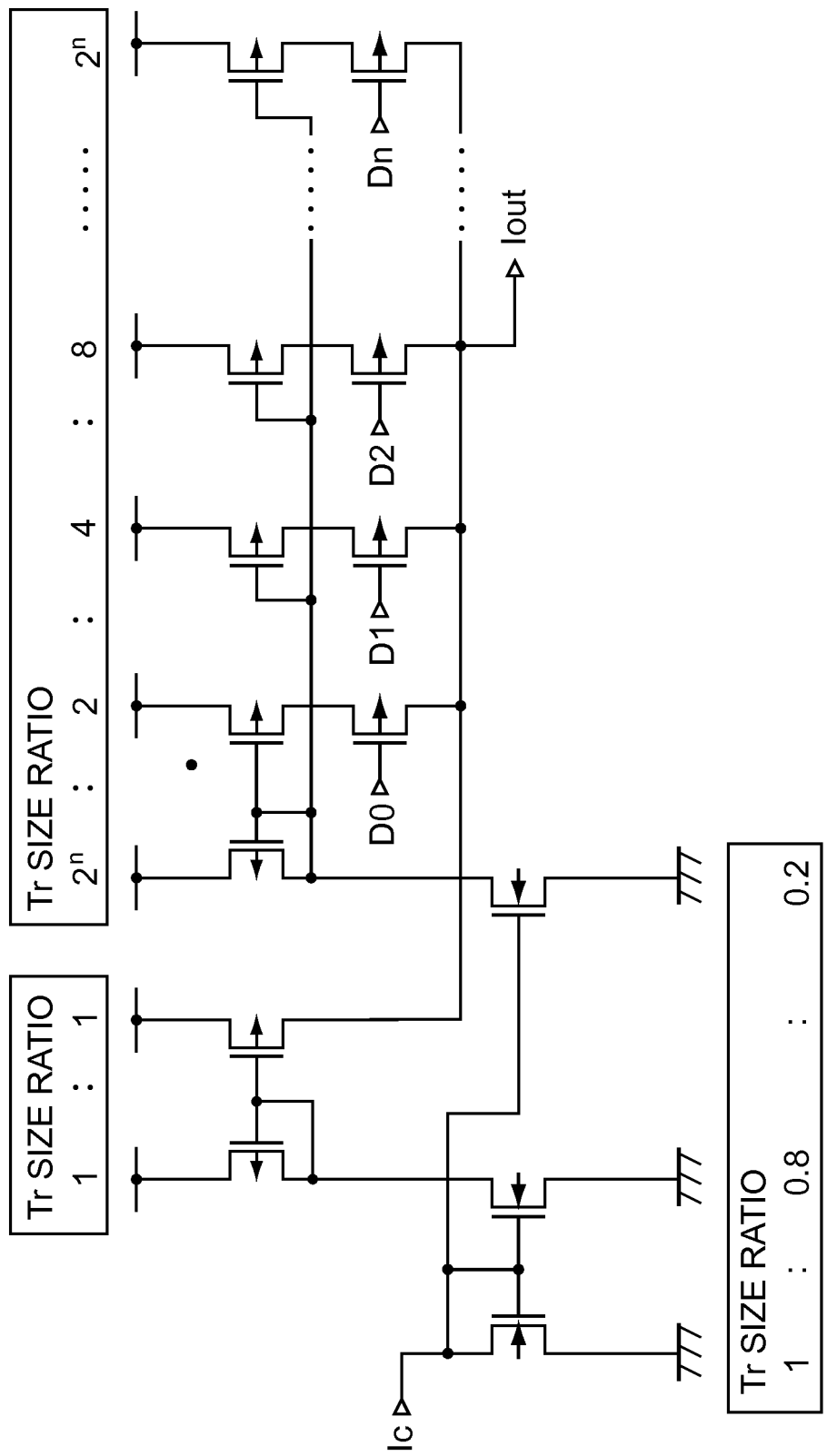
FIG. 7 is a circuit diagram illustrating an example of a circuit configuration of a related current output control device.

For example, in a worst case scenario of from "0111" to "0000", there is a possibility of a transition through "1000". In such cases, there is, for example, a large change in the control current in the current output control device configured as described in Patent Document 1 as illustrated in FIG. 7. As a result, there is a large momentary fluctuation in the oscillation frequency in an oscillation circuit that performs oscillation at a frequency based on the control current.

In the present exemplary embodiment the occurrence of such a problem is prevented by the decoder 100 and the current cell array section 200.

For example, in the current cell array section 200 configured by the 4 row×4 column array illustrated in FIG. 3, when the input code is "0111" the decoder 100 outputs a row code "0011" and a column code "000", as per Table 1.

In such cases, in the current cell array section 200 illustrated in FIG. 3, the row codes row <1> and row <0> are "1", and the NMOS transistor that operates as a switching element in the first type current cells 1, 5 arrayed in the 1$^{st}$ row and the 2$^{nd}$ row are switched on (ON), and current flows.

Moreover, in each of the second type current cells 2 to 4 arrayed in the 1$^{st}$ row, the row code row <1> is "1" and the NMOS transistor that operates as a switching element is switched ON through the OR circuit, and current flows.

Moreover, in each of the third type of current cells 6 to 8 arrayed in the 2$^{nd}$ row, the row code row <1> is "1", the column codes column <2> to column <0> are "0" such that "1" is input through the NOT circuit to the AND circuit, and the NMOS transistor that operates as a switching element is switched ON, and current flows.

However, in the first type current cells 9, 13 arrayed in the 3$^{rd}$ column and 4$^{th}$ column, the row code row <2> and the row code row <3> are "0", and the NMOS transistor that operates as a switching element is switched OFF, and current does not flow.

Moreover, in the second type current cells 10 to 12 arrayed in the 3$^{rd}$ row, the row code row <3> and the row code row <2> are "0", the column codes column <2> to column <0> are "0" and so the NMOS transistor that operates as a switching element is switched OFF and current does not flow.

Moreover, in the third type current cells 14 to 16 arrayed in the 4$^{th}$ row, the row code row <3> and the column codes column <2> to column <0> are "0", and so even when inverted by the NOT circuit, the output of the AND circuit is low, and the NMOS transistor that operates as a switching element is switched off (OFF) and current does not flow.

Thus corresponding to the input code "0111", eight current cells 1 to 8 adopt an on (ON) state out of the current cells 1 to 16.

Next, when the input code has transitioned by just 1 bits worth from "0111" to "1000", in the output of the decoder 100 the row code transitions from "0011" to "0111" but there is no change in the column code from "000" to "000", as illustrated in Table 1.

In such cases, the ON state is maintained for the current cells 1 to 8, since there is no change in the input to the gate of the respective NMOS transistor operating as a switching element. Similarly, the OFF state is also maintained for the current cells 13 to 16 since there is no change in the input. However a change occurs in the input for the current cells 9 to 12.

However, out of the current cells 9 to 12 with changed input, in the current cells 10 to 12 the row code row <3> is "0", the row code row <2> is "1", and the column codes column <2> to <0> are "0", so there is no change to the input to the gate of the NMOS transistor operating as a switching element and current does not flow.

In contrast thereto, only current cell 9 changes to an ON (on) state accompanying change of the row code row <2> to "1". As a result, the current is increased by only one current cells worth on transitioning to the input code "1000" compared to prior to transition ("0111").

This effect is not limited to this example, as according to the present exemplary embodiment just as when the input code is changed from "0111" to "1000", there is always only one current cell that transitions from OFF to ON (or from ON to OFF) whenever the input code transitions to the adjacent input code by changing by 1 bit. The increase or decrease in the control current value is accordingly controlled by only a single current cells worth. Consequently, the timing problem that occurs during switching in the technology of Patent Document 1 may be eliminated.

Note that in the example explained above explanation has been given of a case in which current cells are employed that are arrayed in 4 rows×4 columns, however the present invention is not limited to such an application.

For example, in an M row×N column array of current cells in the current cell array section 200a illustrated in FIG. 4, configuration may be made such that the first type current cells are employed for the 1$^{st}$ column in all of the rows, the second type current cells are employed for the other current cells in the odd numbered rows, and the third type current cells are employed for the other current cells in the even numbered rows.

Namely, in the current cell array section 200a of FIG. 4, the first type current cells that are configured with two serially connected NMOS transistors 200g, 200h are employed for all the 1$^{st}$ column in all of the rows, the second type current cells that are configured with logic circuits of an AND circuit 200i and an OR circuit 200j added to a configuration of the first type current cells are employed for the 2$^{nd}$ column onwards in each of the odd numbered rows (1, 3, and so on), and the third type current cells that are configured with a NOT circuit 200k added to a configuration of the second type current cells are employed for the 2$^{nd}$ column onwards in each of the even numbered rows (2, 4, and so on).

Thus in the current cell array section 200a illustrated in FIG. 4, similarly to in the current cell array section 200 illustrated in FIG. 3, the first type current cells are arrayed in the 1$^{st}$ column for all of the rows, the second type current cells are arrayed from the 2$^{nd}$ column onwards in each of the odd numbered rows, and the third type of current cells are arrayed from the 2$^{nd}$ column onwards in each of the even numbered rows.

In such cases, the decoder 100 has an expanded Table 1 in which the number of "1s" in the odd numbered row column code is increased monotonically from the least significant bit (LSB) until all are ON (on), and the number of "1s" in the even numbered row column code is decreased monotonically from the most significant bit (MSB), then when the row code is switched from an odd numbered row to an even numbered row, the number of "1s" is increased monotonically from the LSB.

Thus even in the current cell array section 200a equipped with the M row×N column array of current cells as illustrated in FIG. 4, there is always only 1 current cell that transitions from OFF to ON (or from ON to OFF) when the input code transitions to the adjacent input code by changing by 1 bit, and the increase or decrease in control current value is controlled to a single current cells worth.

Note that although in the current output control device of the present exemplary embodiment configuration is made such that the externally input code to the decoder 100 changes in 1 bit units, and the number of current cell circuits that are on in the current cell array section 200 changes by 1 for each input code change of 1 bit, configuration may also be made such that, for example, the number of current cell circuits that are on in the current cell array section 200 changes by 2 each time the input code changes by 1 bit.

A digitally controlled oscillator may be configured by combining such a current output control device with a current controlled oscillator that changes oscillation frequency according to the increase or decrease in control current that has been changed by the current output control device, such as the current-control oscillation circuit 300 illustrated in FIG. 1 and FIG. 2.

Moreover, as a digitally controlled oscillator, configuration may be made employing a voltage-control oscillation circuit in place of a current controlled oscillator such as the current-control oscillation circuit 300. In such cases, a current-voltage conversion circuit is provided to increase or decrease a voltage value according to increase or decrease of control current that has been changed by the current output control device. The oscillation frequency of the voltage-control oscillation circuit is changed according to the increase or decrease in the voltage value converted by the current-voltage conversion circuit.

Moreover, a digital PLL may be configured by employing a digitally controlled oscillator such as this, and a phase comparator (for example a time-to-digital converter) that performs comparison of phase of a frequency of output signal from the digitally controlled oscillator and a frequency of a reference input signal.

Moreover, a frequency synthesizer may be configured by employing a digitally controlled oscillator such as this, a divider that divides an output signal from the digitally controlled oscillator and a phase comparator that performs comparison of a phase of a frequency of output signal (clock signal) divided by the divider and a frequency of a reference input signal.

Moreover, a digital FLL may be configured by employing a digitally controlled oscillator such as this, and a frequency comparator that performs comparison of a frequency of output signal from the digitally controlled oscillator and a frequency of a reference input signal.

Moreover, a semiconductor device may be configured that includes at least 1 of the above digital PLL, or the above frequency synthesizer, or the above digital FLL, one or more than one peripheral circuit that performs a specific operation using the clock signal that has been output from whichever out of the digital PLL, the frequency synthesizer and the digital FLL is provided, and a central processing unit that controls operation of the peripheral circuit using the output clock signal.

Figure 5:
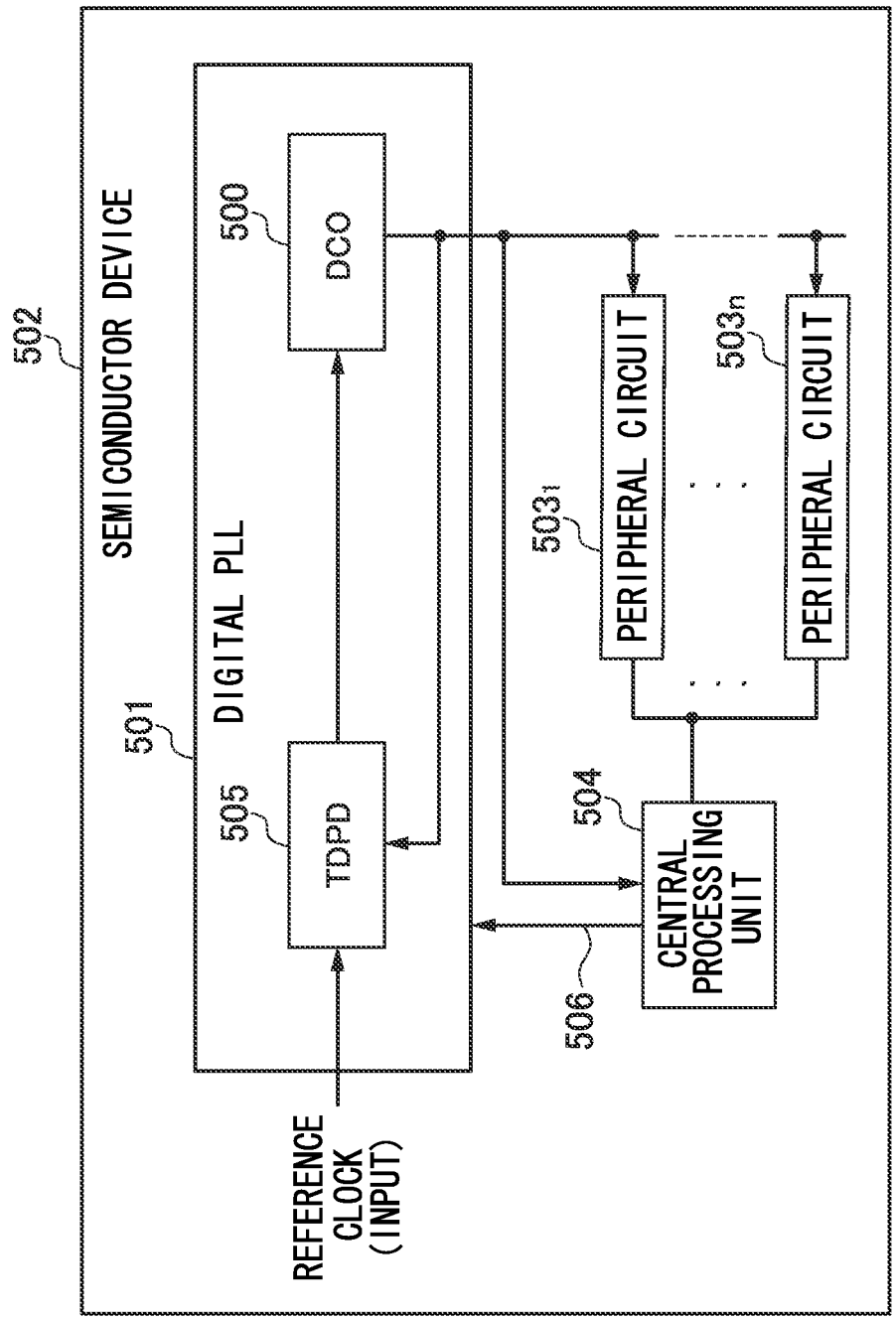
FIG. 5 is a block diagram illustrating an example of a configuration of a semiconductor device equipped with a digitally controlled oscillator according to an exemplary embodiment.

FIG. 5 illustrates a configuration of a digital PLL 501 equipped with a digitally controlled oscillator 500 configured as illustrated in FIG. 1 (labeled "DCO" in the drawing) and a phase comparator 505 (labeled "TDPD" in the drawing), and a configuration of a semiconductor device 502 equipped with the digital PLL 501.

In the semiconductor device 502, n (wherein n is 1 or more) peripheral circuits 503$_1$ to 503$_n$ are provided that perform a specific operation based on a clock signal output from the digital PLL 501, and a central processing unit 504 that controls the operation of each of the peripheral circuits 503$_1$ to 503$_n$ using the clock signal output from the digital PLL 501 as a systems clock. Note that the central processing unit 504 is connected to the digital PLL 501 through a control line 506, and for example generates an input code based on a comparison result of a phase comparator 505, and inputs the generated input code to a decoder (100) in the digitally controlled oscillator 500.

Such a semiconductor device 502 is employed in an electronic device such as a mobile phone, a communication device or a personal computer.

Note that in FIG. 5, in the central processing unit 504 configuration is made to generate an input code based on a comparison result of the phase comparator 505 and input to a decoder (100) in the digitally controlled oscillator 500, however in the digitally controlled oscillator 500 configuration may be made with a logic circuit provided in the digitally controlled oscillator 500 to generate an input code based on a comparison result of the phase comparator 505 and input to the decoder (100).

Figure 6:
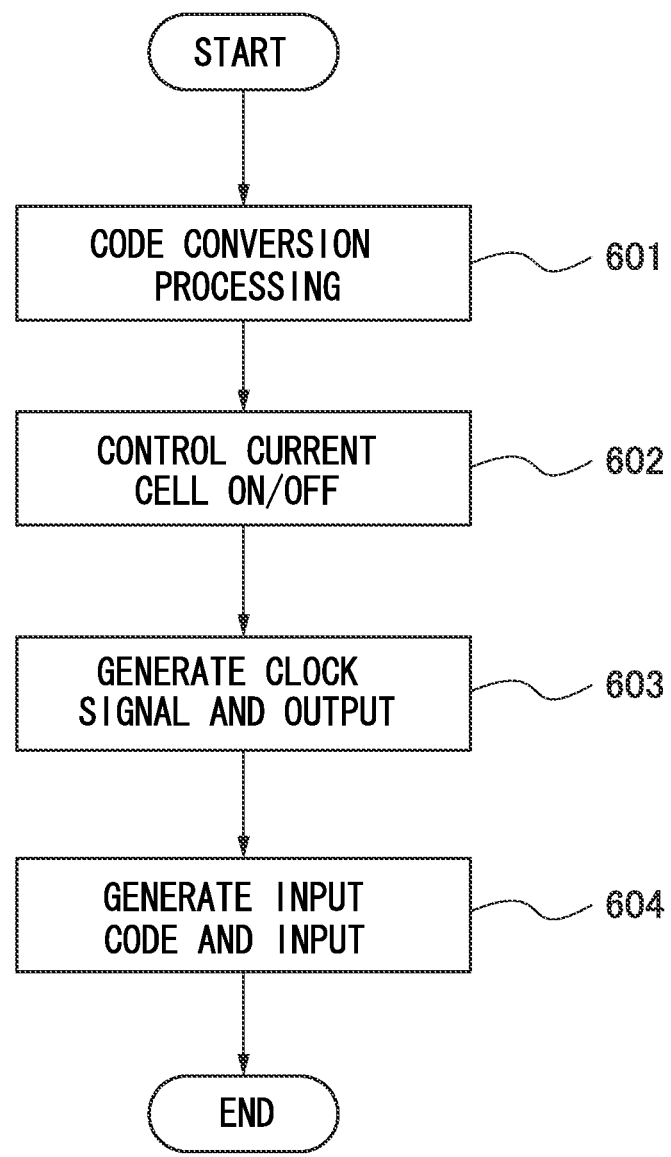
FIG. 6 is a flow chart illustrating an example of a processing operation of a current output control method according to an exemplary embodiment.

FIG. 6 illustrates an example of an operation sequence of a current output control method according to the present exemplary embodiment for a digitally controlled oscillation circuit in FIG. 1. At step 601, the decoder 100 converts an input code into a row code and a column code and outputs to the current cell array section 200. At step 602, in the current cell array section 200, ON/OFF control is performed on current cells according to the input row codes and column codes, such that the value of the control current is increased or decreased.

At step 603, the current-control oscillation circuit 300 generates a clock signal of a frequency according to the control current that has been increased or decreased by the current cell array section 200.

At step 604, an input code is generated by a central processing unit according to a frequency comparison result between a clock signal output from the current-control oscillation circuit 300 and a reference clock, and the generated input code is input to the decoder 100.

As explained above, according to the present exemplary embodiment, a current value of a control current for output is monotonically increased or monotonically decreased according to changes in an externally input code. By so doing, deterioration in jitter characteristics such as of a DCO that employs a control current to control an oscillation frequency may be avoided. Moreover, an improvement in the performance of a digital PLL or digital FLL employing such a DCO, and an improvement in the performance of an electronic device such as a mobile phone employing such a digital PLL or digital FLL, may be achieved.

Note that the present invention is not limited to the exemplary embodiments that have been explained using each of the drawings, and various modifications are possible within a range not departing from the spirit of the present invention. For example, the present example is, as illustrated in FIG. 3, configured with current cells arrayed in a matrix, however in a current output control device of the present exemplary embodiment each of the current cells may be arrayed in a single column, and in the decoder 100, a signal for separately ON/OFF controlling each of the individual current cells may be generated according to changes in the input code.

Moreover, although in the present example NMOS transistors are employed as switching elements and constant current sources of the current cells, PMOS transistors may be employed if the logic of the decoder is reversed. In such cases, a current-control oscillation circuit (CCO) may change current flowing through a PMOS transistor of the current cells so as to be received with an NMOS transistor, and there is no limitation to the illustrated configuration.

Moreover, in the present example, explanation has been given employing 3 examples of circuit configurations of the current cells, the first type to the third type, however other than this, for example 4 types of current cell circuit configuration may be employed, and there is no limitation to the 3 types of the first type to the third type.

Moreover, explanation has been given of a case in which 3 types of the first type to the third type serve as current cell circuit configurations, however other than this, for example, 3 types with different circuit configuration may be made by reversing "1" and "0" in the decode.

Moreover, although changes are made 1 bit at a time in the present exemplary embodiment, changes may be made a specific number of bits at a time, such as for example 2 bits, 3 bits or 4 bits, and there is no limitation to changing 1 bit at a time.

Moreover, although in the present exemplary embodiment digital signals are generated such that the number of current cell circuits that are in the ON state is greater as the input code becomes high (active) in sequence from the least significant bit, and the generated digital signal is input to each of the current cell circuits, configuration may be made such that, for example, digital signals are generated such that the number of the current cell circuits that are in the ON state becomes greater as the input code becomes high (active) in sequence from a specific significant bit, rather than from the least significant bit.

Moreover, configuration may be made such that rather than high for a bit being active and low being inactive, by making low active and high inactive, digital signals are generated such that the number of current cell circuits that are in the ON state becomes greater as the input code becomes low (active) in sequence from the least significant bit, or the number of current cell circuits in an ON state becomes smaller as the input code becomes high (inactive) in sequence from the most significant bit.

What is claimed is:

1. A current output control device comprising:
   a current cell array section including a plurality of current cell circuits that are each connected in parallel between a first terminal and a second terminal, whose ON/OFF state is switched by an input signal, that disconnect from the first terminal and the second terminal in the OFF state, that connect between the first terminal and the second terminal in the ON state so as to increase current flowing between the first terminal and the second terminal; and
   a code conversion section that generates signals to change a number of current cell circuits that are in the ON state according to change in an externally input code and that inputs the generated signals to the respective current cell circuits,
   wherein the current cell circuits in the current cell array section are arranged in an M row×N column array,
   wherein the code conversion section generates the signals and inputs the signals to the respective current cell circuits such that as the input code becomes active in sequence from the lowest significant bit, a specific individual number of the current cell circuits in each row are switched ON from the $1^{st}$ column to the $N^{th}$ column for each row in sequence from the 1st row to the $M^{th}$ row,
   wherein the code conversion section includes a decoder section that converts the input code into row code signals for M rows and column code signals for N columns; and
   wherein the decoder section, as the input code becomes active in sequence from the least significant bit, increases an active number of signals by a specific number of units in sequence from the least significant bit until all are active for the column code signals of odd numbered rows, decreases an active number of signals by the specific number of units in sequence from the most significant bit for the column code of even numbered rows, and increases a number of active signals in sequence from one less significant bit for the row code when switching over from an odd numbered row to an even numbered row.

2. The current output control device of claim 1, wherein the code conversion section generates the signals and inputs the signals to the respective current cell circuits such that a greater number of the current cell circuits are in the ON state as the input code progresses to active in sequence from a specific position.

3. The current output control device of claim 1,
   wherein the current cell circuit of the current cell array section includes:
      M individual first type current cell circuits that includes a first transistor with a drain connected to the first terminal and a gate input with a signal from the code conversion section and a second transistor with a drain connected to a source of the first transistor, a source connected to the second terminal and a gate applied with a constant bias voltage,
      (M/2)×(N−1) individual second type current cell circuits that includes the configuration of the first transistor and the second transistor, an OR circuit whose output terminal is connected to the gate of the first transistor, and an AND circuit whose output terminal is connected to one input terminal of the OR circuit, and (M/2)×(N−1) individual third type current cell circuits that includes the configuration of the first transistor and the second transistor, an OR circuit whose output terminal is connected to the gate of the first transistor, an AND circuit whose output terminal is connected to one input terminal of the OR circuit, and a NOT circuit whose output terminal is connected to one input terminal of the AND circuit, wherein the M individual first type current cell circuits are disposed in the $1^{st}$ column of all the rows and have code signals for the M rows input from the decoder section to the gates of the respective first transistors, wherein the (M/2)×(N−1) individual second type current cell circuits are disposed in the $2^{nd}$ column onwards for each of the odd numbered rows, the respective AND circuits have a code signal from the decoder section for the respective row input to one input terminal and a code signal for the respective column input to another input terminal, and the respective OR circuits have the code signal for the row one position higher than the respective row input to another input terminal, and wherein the (M/2)×(N−1) individual third type current cell circuits are disposed in the $2^{nd}$ column onwards in each of the even numbered rows, and the respective AND circuits have a code signal from the decoder section for the respective row input to one input terminal, the code signal for the respective column input to the NOT circuit, and the respective OR circuits have the code signal for the row one position higher than the respective row input to another input terminal.

4. The current output control device of claim 1, wherein:
the externally input code changes in 1 bit units, and a number of the current cell circuits that connect the first terminal and the second terminal together is changed by only 1 each time the code changes by 1 bit.

5. A digitally controlled oscillator comprising:
the current output control device of claim 1;
a current-control oscillation circuit that changes an oscillation frequency of a clock signal according to increase or decrease in the current that has been changed by the current output control device.

6. A digitally controlled oscillator comprising:
the current output control device of claim 1;
a current-voltage conversion circuit that increases or decreases a voltage value according to increase or decrease in the current that has been changed by the current output control device; and
a voltage-control oscillation circuit that changes the oscillation frequency of a clock signal according to increase or decrease to the voltage value by the current-voltage conversion circuit.

7. A digital PLL comprising:
the digitally controlled oscillator of claim 5; and
a phase comparator that performs a phase comparison between a frequency of clock signal from the digitally controlled oscillator and a frequency of a reference input signal.

8. A digital PLL comprising:
the digitally controlled oscillator of claim 6; and
a phase comparator that performs a phase comparison between a frequency of clock signal from the digitally controlled oscillator and a frequency of a reference input signal.

9. A frequency synthesizer comprising:
the digitally controlled oscillator of claim 5;
a divider that divides a clock signal from the digitally controlled oscillator; and
a phase comparator that performs a phase comparison between a frequency of the clock signal divided by the divider and a frequency of a reference input signal.

10. A frequency synthesizer comprising:
the digitally controlled oscillator of claim 6;
a divider that divides a clock signal from the digitally controlled oscillator; and
a phase comparator that performs a phase comparison between a frequency of the clock signal divided by the divider and a frequency of a reference input signal.

11. A digital FLL comprising:
a digitally controlled oscillator of claim 5; and
a frequency comparator that performs a comparison between a frequency of a clock signal from the digitally controlled oscillator and a frequency of a reference input signal.

12. A digital FLL comprising:
a digitally controlled oscillator of claim 6; and
a frequency comparator that performs a comparison between a frequency of a clock signal from the digitally controlled oscillator and a frequency of a reference input signal.

13. A semiconductor device comprising:
the digital PLL of claim 7;
one or more peripheral circuit that performs a specific operation using the clock signal that has been output from the digital PLL; and
a central processing unit that controls operation of the peripheral circuit using the output clock signal.

14. A semiconductor device comprising:
the digital PLL of claim 8;
one or more peripheral circuit that performs a specific operation using the clock signal that has been output from the digital PLL; and
a central processing unit that controls operation of the peripheral circuit using the output clock signal.

15. A semiconductor device comprising:
the frequency synthesizer of claim 9;
one or more peripheral circuit that performs a specific operation using the clock signal that has been output from the frequency synthesizer; and
a central processing unit that controls operation of the peripheral circuit using the output clock signal.

16. A semiconductor device comprising:
the frequency synthesizer of claim 10;
one or more peripheral circuit that performs a specific operation using the clock signal that has been output from the frequency synthesizer; and
a central processing unit that controls operation of the peripheral circuit using the output clock signal.

17. A semiconductor device comprising:
the digital FLL of claim 11;
one or more peripheral circuit that performs a specific operation using the clock signal that has been output from the digital FLL; and
a central processing unit that controls operation of the peripheral circuit using the output clock signal.

18. A semiconductor device comprising:
the digital FLL of claim 12;
one or more peripheral circuit that performs a specific operation using the clock signal that has been output from the digital FLL; and a central processing unit that controls operation of the peripheral circuit using the output clock signal.

19. A current output control method comprising:
generating signals for a current cell array section including a plurality of current cell circuits that are respectively connected in parallel between a first terminal and a second terminal, whose ON/OFF state is switched by input signals, that disconnect from the first terminal and the second terminal in the OFF state, that connect between the first terminal and the second terminal in the ON state so as to increase current flowing between the first terminal and the second terminal, the generated signals changing a number of the current cell circuits that are in the ON state according to change in an externally input code, and inputting the generated signals to the current cell circuits; and using the current cell array section to change the number of current cell circuits that are placed in the ON state based on the signals, wherein the current cell circuits in the current cell array section are arranged in an M row×N column array, wherein the signals generated in the generating step are input to the respective current cell circuits such that as the input code becomes active in sequence from the lowest significant bit, a specific individual number of the current cell circuits in each row are switched ON from the $1^{st}$ column to the $N^{th}$ column for each row in sequence from the 1st row to the $M^{th}$ row, and wherein the generating step comprises:
converting the input code into row code signals for M rows and column code signals for N columns, and as the input code becomes active in sequence from the least significant bit, increasing an active number of signals by a specific number of units in sequence from the least significant bit until all are active for the column code signals of odd numbered rows, decreasing an active number of signals by the specific number of units in sequence from the most significant bit for the column code of even numbered rows, and increasing a number of active signals in sequence from one less significant bit for the row code when switching over from an odd numbered row to an even numbered row.

* * * * *